United States Patent [19]

Perkins

[11] Patent Number: 4,876,518
[45] Date of Patent: Oct. 24, 1989

[54] FREQUENCY TRACKING SYSTEM

[75] Inventor: Geoffrey W. Perkins, Chandler, Ariz.

[73] Assignee: Motorola Inc., Schaumburg, Ill.

[21] Appl. No.: 279,182

[22] Filed: Dec. 2, 1988

[51] Int. Cl.⁴ .............................................. H03L 7/00
[52] U.S. Cl. ..................................... 331/1 A; 331/11; 331/25
[58] Field of Search ............................ 331/1 A, 11, 25

[56] References Cited
U.S. PATENT DOCUMENTS 4,258,333  3/1981  Demuliere et al. ................. 331/111
4,272,729  6/1981  Riley, Jr. ......................... 331/111 X Primary Examiner—Eugene R. LaRoche
Assistant Examiner—Robert J. Pascal

[57] ABSTRACT

A system for automatically tracking and locking to an applied scanning input signal the frequency of which may vary over a range of frequencies includes a PLL comprising a VCO and phase detector as well as a digital frequency counting section which forms a closed loop with the VCO. The VCO is operated preferably at 32 times the frequency of the applied input signal and provides a clock signal to the digital section which also receives the input signal. The digital section includes a counter and decoder-latch wherein the clock signal that is supplied to the counter is used to measure the frequency of the applied input signal. Counting and decoding result on alternating periods of the applied input signal such that the decoder-latch decides if the count is too low, too high or within the range of the PLL and controls the operating frequency of the VCO to find and maintain phase lock.

10 Claims, 3 Drawing Sheets

FREQUENCY TRACKING SYSTEM

BACKGROUND OF THE INVENTION

The present invention relates to a frequency tracking system and, more particularly, to a system for phase locking onto a horizontal scanning frequency pulse used in conjunction with personal computers (PC) monitors and the like.

Television receivers and PC monitors are driven by a horizontal and vertical scanning frequency pulse commonly referred to as horizontal and vertical sync pulses. More specifically, a prior art PC monitor system is available that can lock to horizontal scanning sync pulses the frequencies of which can vary from 15.5 Khz to 35 Khz. The conventional technique to achieve lock in to the horizontal sync pulse uses a phase locked hoop (PLL) much like the common television receiver but with the addition of a frequency to voltage converter. The frequency to voltage converter sets the center range of horizontal voltage controlled oscillator (VCO) of the phase lock loop depending on the frequency of the input synchronization pulses.

In the prior art PC monitor system the frequency to voltage converter is operated in an open loop mode and only provides a frequency offset to the VCO. This means that the frequency to voltage converter and the VCO of the PLL must be very accurate to insure the PLL will lock over the whole frequency range of the applied horizontal sync pulses. The pull-in range of the PLL must be relatively narrow to prevent false lock conditions that can be caused by harmonics and subharmonics of the synchronizing signal.

To ensure linear tracking and accuracy between the frequency to voltage converter and the VCO, the prior art system utilizes many discrete components and requires adjustments of some of these components.

Hence, a need exists for a simplified frequency tracking system that is suitable for use in PC monitors and the like which can be integrated in a monolithic integrated circuit which does not require precision components thereby eliminating the need for large numbers of external and discrete components.

SUMMARY OF THE INVENTION

Accordingly, it is the object of the present invention to provide an improved frequency tracking system.

It is another object to provide a frequency tracking system that can be locked to horizontal scanning frequency input signals that may vary over a range of 50 frequency.

Still another object of the invention is to provide a improved horizontal frequency tracking system for PC monitors.

Yet another object of the present invention is to provide a horizontal frequency tracking system that automatically locks to horizontal scanning frequency applied pulses that vary over a range of frequencies.

Still yet another object of this present invention is to provide an integrated circuit suitable for locking on to horizontal scanning frequency pulses including a close loop system using digital circuitry techniques.

In accordance with the above and other objects there is provided a system for locking to and tracking horizontal frequency pulses that comprises a VCO operated at a predetermined multiple, x, of the frequency of the horizontal synchronization pulses apply to the system a herein the output of the VCO is divided by the multiplication factor x and supplied to an input of a phase detector the latter of which receives the horizontal synchronization frequency pulses at a second input. The phase detector produces an error voltage which is utilized to provide a direct current error voltage to the VCO accordingly. The VCO and phase detector form a conventional phase lock loop. In addition, the output, of the VCO as well as the horizontal frequency pulses are applied to a digital frequency tracking section that includes a counter and decoder-latch circuitry for generating error output current signals to force the VCO within the lock up range of the PLL if the applied synchronization pulses are either too high or too low with respect to the operating frequency of the VCO. If the horizontal synchronization pulses are within the lockup range of the PLL no error current signals are produced by the digital frequency tracking system.

DETAILED DESCRIPTION OF THE PREFERRED EMBODIMENT

Figure 1:
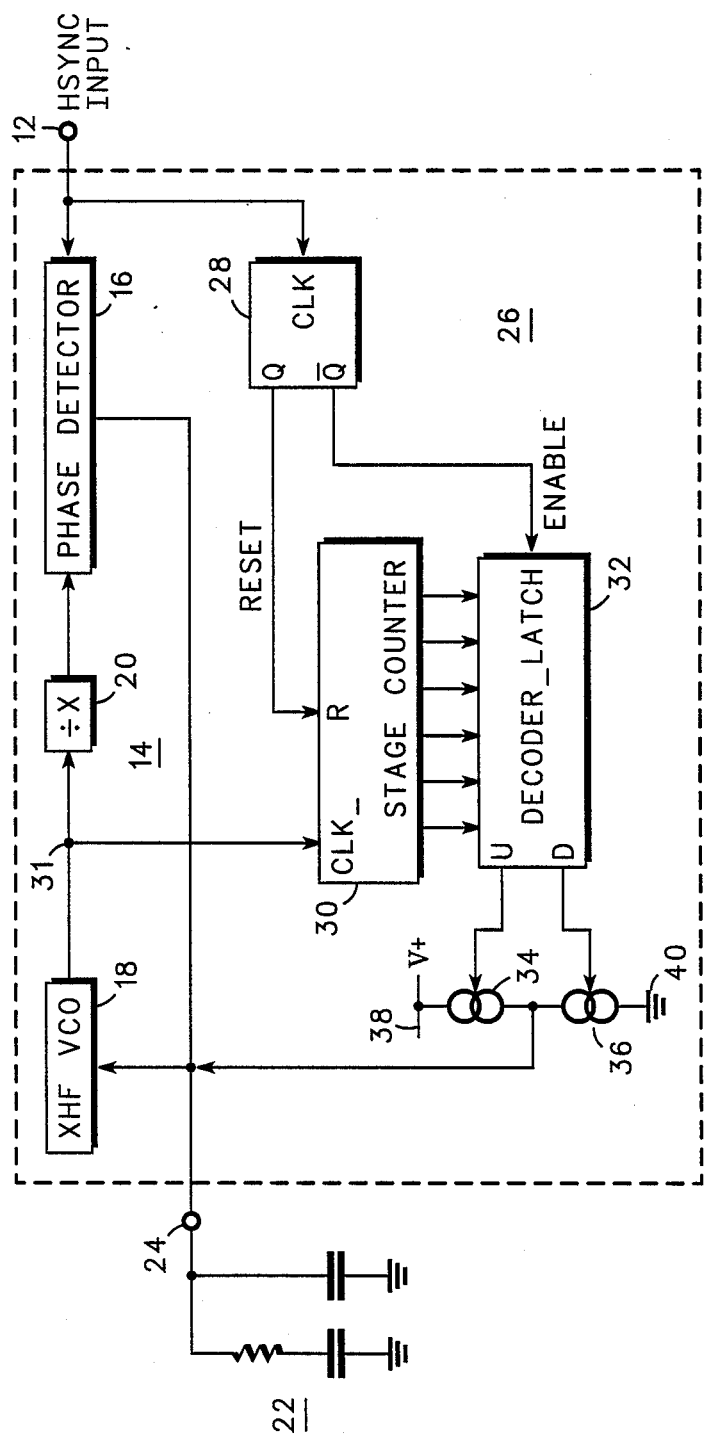
FIG. 1 is a simplified and schematic and block diagram illustrating the frequency tracking system of the present invention.
Figure 2:
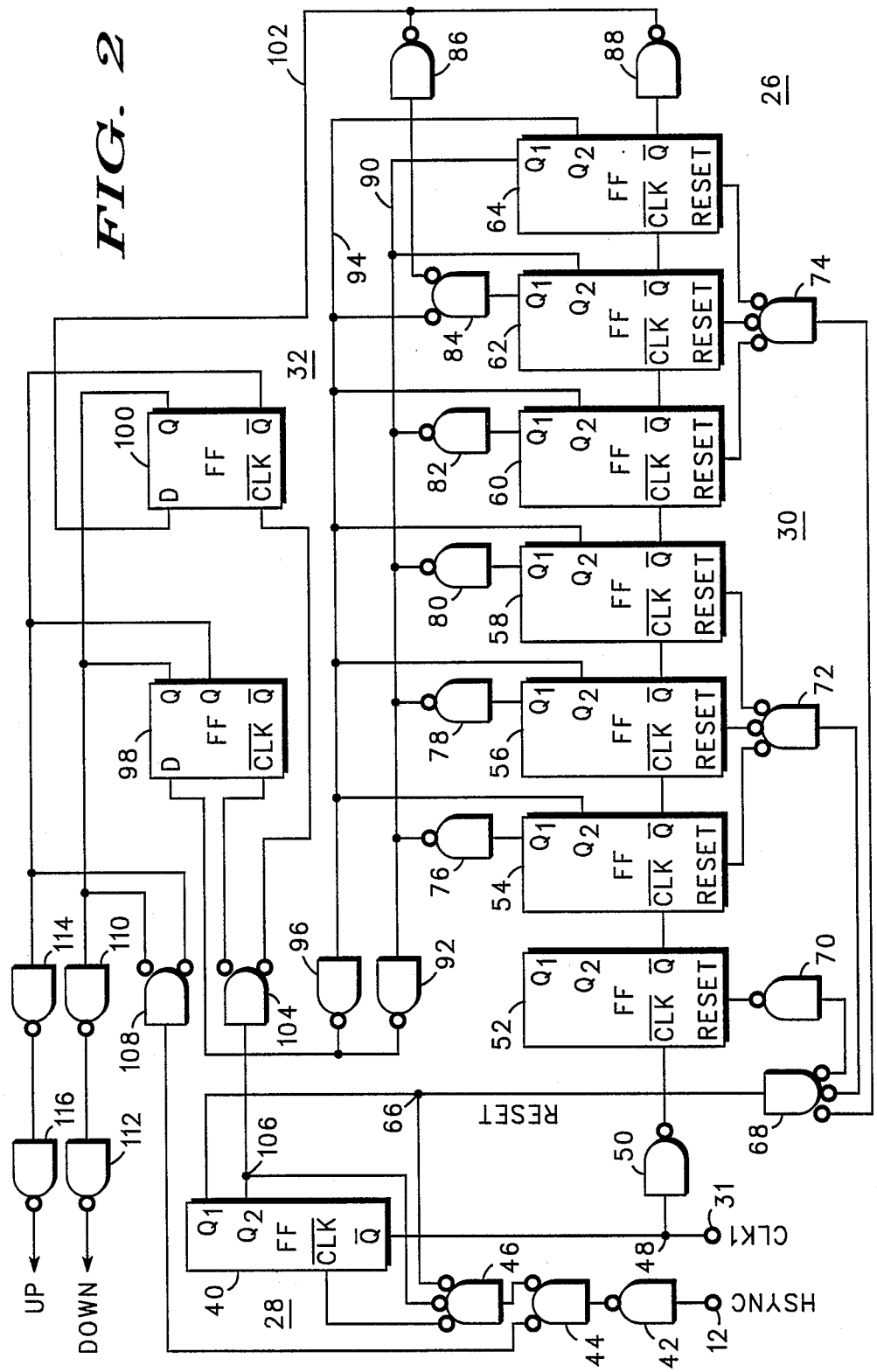
FIG. 2 is a detailed logic schematic of a portion of the frequency tracking system of FIG. 1.

Turning to FIG. 1 there is illustrated a simplified schematic of frequency tracking system 10 of the present invention. It is understood that frequency tracking system 10 maybe utilized to lock in and track synchronizing pulses applied to input 12, although specifically, system 10 is utilized to track horizontal frequency synchronization pulses, (Hsync), supplied to PC monitors or the like. The components of system 10 which are included within the dashed in box are suited to be integrated, for example, using integrated injection logic ($I^2L$), in monolithic integrated circuitry.

System 10 includes a conventional type of PLL comprising phase detector 16, VCO 18, divider 20 and low pass filter 22 the latter of which would be externally coupled to the IC included within the dashed in box. VCO 18 is operated at x times the frequency of the horizontal sync pulses applied at input 12. For discussion purposes, the multiplication factor x will be assumed to be 32 although any positive integer may be used. Hence, the oscillation signal produced by VCO 18 is 32 times the sync pulses applied at input 12. The output of VCO 18 is applied to divider 20 which divides the frequency of the oscillation signals by the multiplication factor x. The divided oscillation signal is then supplied at the output 20 to one input of phase detector 16. As understood, if the horizontal sync pulses supplied at input 12 are the same frequency and phase as signals applied from divider 20 no error signal is generated at the output of the phase detector 16. However, if the frequencies of the signals applied at the two inputs of phase detector 16 are different, an error signal is generated at the ouput of the phase detector which when applied across low pass filter 22, at terminal 24, produces a DC offset voltage at the controlled input terminal of VCO 18. This DC offset voltage drives the frequency then of the VCO 18 towards the frequency of the sync pulses such that the phase lock loop becomes locked to the sync pulses.

As system 10 is to be operated with horizontal sync pulses, the frequency of which may vary over a wide range, it is necessary that VCO 18 track the frequency of the input pulses to ensure that lock in of the PLL will occur over the whole range. System 10 provides automatic locking by placing VCO 18 in a close loop with digital frequency tracking section 26.

Tracking section 26 includes a divide by 2 flip flop 28 which receives a clocking input signal corresponding to the horizontal sync pulses supplied at input 12, a digital counter 30 and decoder-latch 32. The VCO output signal occurring at node 31 is also supplied as a clocking signal input to counter 30 the latter of which provides multiple output to decoder-latch 32. Flip flop 28 also provides an enabling signal to decoderlatch 32 as shown.

Although oscillator 18 can be set to run at any predetermined multiple frequency of the applied horizontal synchronizing pulses, for the following discussion the multiplication factor x is assumed to equal 32. Hence, oscillator 18 runs at 32 times the horizontal frequency, H. The 32 H clock signal supplied to counter 30, which may be, for example a seven stage digital flip flop counter, is used to measure the frequency of the incoming horizontal synchronization pulses with respect to the oscillator frequency. Thus, VCO 18 and digital frequency tracking section 26 form in conjunction with each other a closed loop system to keep the frequency of oscillator 18 within the lockup range of PLL 14 using digital techniques.

The divide by 2 flip flop 28 allows counting and decoding the results of the count on alternate synchronizing pulse periods of the applied horizontal synchronization pulse. This means that, in response to a first horizontal synchronization pulse, both counter 30 is reset and decoder-latch 32 is enabled. Counter 30 begins thereafter to count upwards of 32 times until the next horizontal synchronization pulse appears at input 12. At this time counter 30 is disabled and the data held in decoder-latch 32 is held. Upon the next sync pulse the data in the decoder-latch 32 is utilized to provide either a current control error signal at one or the other of the U and D outputs or not depending upon the preceding count. The decoder portion of decoder-latch 32 decides if the count is too low, too high or within the range of PLL 14 and control pullup and pull down current source 34 and 36 to find phase lock. Thus, for example, if the count is too high, the running frequency of oscillator 18 is to low, in this condition pull up current source 34 will be turned on to produce an increase in a direct current voltage across low pass filter 22 at terminal 24. This will cause the frequency of oscillator 18 to increase until it phase locks to the frequency of the horizontal synchronization pulses. Similarly, if the count is too low, pull down current supply 36 is enabled to reduce the direct current offset voltage to oscillator 18 to thereby reduce its operating frequency. If the count is within the pull in range of PLL 14, both current sources 34 and 36 are disabled. As will be explained, the transfer of the information to produce the U and D current control error signals takes place at the initiation of the alternate horizontal synchronization pulse and occurs before the reset of of counter 30. It is noted that although counter 30 may have any number of counter stages, by having seven, a range of 4 to 1 in horizontal frequency can be covered.

Turning now to the remaining Figures digital frequency tracking section 26 will be explained in greater detail. Divide by two flip flop 28 is shown as including three serially connected Nand gates 42, 44, and 46 as well as flip flop 40. The horizontal synchronization pulses applied at terminal 12 are also applied to the input of Nand gate 42. One output of Nand gate 46 is coupled to the clock input of flip flop 40 while a second output of Nand gate 46 is applied to a first true output of the flip flop.

Flip Flop 40, has complimentary outputs Q1, Q2 and $\overline{Q}$. The Q1 output of flip flop 40 is wire Anded to a second output of Nand gate 42 and supplies a reset signal to counter 30. The $\overline{Q}$ output of flip flop 40 is connected at node 48 to the input of Nand gate 50, the latter of which receives clock signal, clock 1, from oscillator 18 supplied at node 31.

The output of Nand gate 50 is coupled to the first stage of counter 30 at the $\overline{CLK}$ input of flip flop 52 the $\overline{Q}$ output of which is coupled to the $\overline{CLK}$ input of flip flop 54. Similarly, flip flops 54, 56. 58, 60, 62 and 64 each have their respective $\overline{CLK}$ inputs coupled to the $\overline{Q}$ output of the preceding flip flop of the seven stage counter 30. The reset pulse applied to the input of Nand gate 68 is coupled through Nand gate 70, 72, and 74 to the respective reset inputs of the aforementioned counter stages to cause the $\overline{Q}$ output thereof to be reset to zero while the $\overline{Q}$ outputs are rest to a logic 1. As illustrated, the Q1 outputs of flip flops 54, 56, 58, 60 and 62 are coupled to respective inputs of Nand gates 76, 78, 80, 82, and 84 of the decoder section of decoder-latch 32. The outputs of Nand gates 76, 78, 80 and 82 are wire Anded along with the Q2 output of flip flop 62 and the Q1 output of flip flop 64, via lead 90, to the input of Nand gate 92. The Q2 outputs of flip flops 54, 56, 58, 60 and 64, as well as the one output of Nand gate 84, are wire Anded via lead 94 to the input of Nand gate 96. The outputs of Nand gates 92 and 96 are wire Anded together and are coupled to the data input of latch flip flop 98, the true output, Q, of which is coupled to an input of Nand gate 110. The $\overline{Q}$ output of flip flop 64 of counter 30 is coupled via Nand gate 88, by lead 102, to the data input of latch flip flop 100. A clock signal is supplied to the $\overline{CLK}$ inputs of the two latches 98 and 100 from the outputs of Nand gate of 104, the input of the latter being coupled to node 106 at which an output of Nand gate 46 and the Q2 output of flip flop 40 are wire Anded. The Q output of latch 98 is wire Anded with an output of Nand gate 108 to the input of Nand gate 110. The input of Nand gate 110 is Anded to the Q output of latch 100 while the output thereof is coupled to the input of Nand gate 112. The $\overline{Q}$ output of latch 100 is Anded with a second output of Nand gate 108 to the input of Nand gate 114, the output of which is coupled to the input of Nand gate 116. The respective outputs of Nand gates 112 and 116 provide control of the current sources 36 and 34 respectively.

Figure 3:
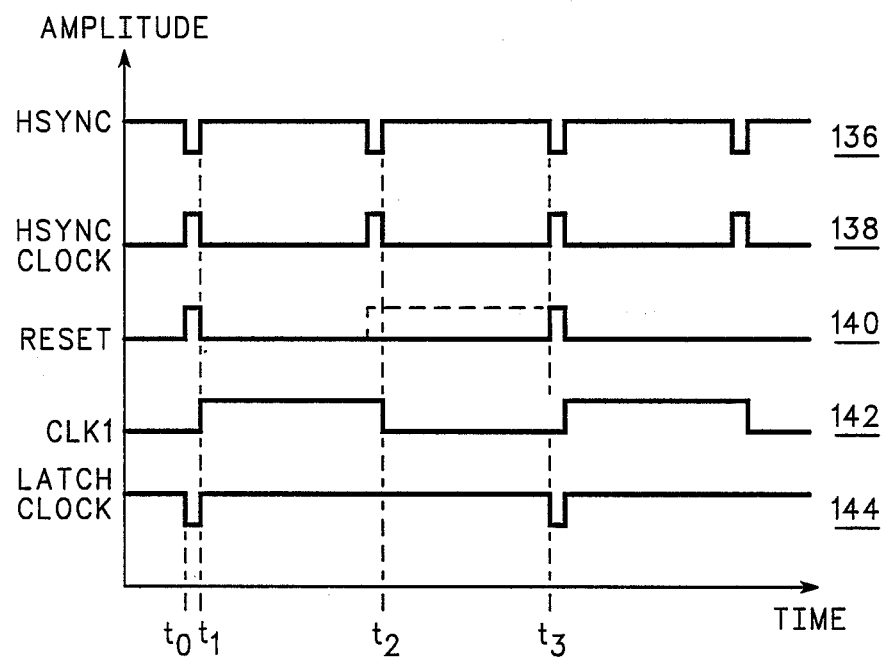
FIG. 3 are wave forms useful for the understanding the operation of the logic circuit shown in FIG. 2

Turning to the wave forms illustrated in FIG. 3 a detailed explanation of digital frequency counting section 26 will be explained. It is understood that the digital counting section can be integrated using conventional $I^2L$ processed fabrication techniques. Moreover, in the following discussion, it is to be understood that each of the flip flops are triggered by the negative going edge of the clock signal applied thereto.

The initiation of a horizontal synchronization pulse (136) at time to at input 12 produces a positive sync clock signal (138) at the $\overline{CLK}$ input of flip flop 40. Simultaneously, the same pulse is produced at node 66 from the out put of Nand gate 46. Hence, at time to, each of the flip flop counter stages of counter 30 are reset by reset pulses 140 being applied at at the input of Nand gate 68. Counter 30 is enabled at time $t_1$ on the negative transition of the sync clock pulse 138 as the $\overline{Q}$ output of flip flop 40 goes high. This permits counter 30 to begin counting at the clock rate of the frequency of oscillator 18. Thus, between $t_1$ and $t_2$ counter 30 counts for one horizontal sync period. At time $t_2$, counter 30 responds to the next synchronization clock pulse 138 going negative wherein, the $\overline{Q}$ output of flip flop 40 goes low and disables counter 30 during the next period of the horizontal synchronization pulse. Counter 30 will therefore be disabled until time $t_4$ Therefore, the count at the Q outputs of flip flops 54, 56, 58, 60, 62, and 64 will be held between $t_2$ and $t_4$ Reset of counter 30 is not initiated in response to the next synchronization pulse 136 just prior to time $t_2$ since node 66 is held low by the Q1 output of flip flop 40 being in a low state. Thus, during this alternate period of the synchronization pulse, the data appearing at the outputs of the counter flip flops will not be changed. This data, which is decoded by Nand gates 92 and 96 is applied at their Anded outputs to the data input of latch 98. At time $t_3$, a latch clock signal (144) is initiated which transfers the count information through latch 98. Similarly, the digital information appearing at the output of Nand gate 88 is also transferred through latch 100 at time $t_3$. This information, indicates if the frequency of oscillator 18 is too high or too low with respect to the frequency of the synchronization pulse applied at input 12. If the frequency of oscillator 18 is too high, the output of Nand gate 88 will be at a logic 1 and if the frequency is too low the output of the gate will be a logic 0.

The operation of counter 30 is such that if the count is below a predetermined number, for example 31, if oscillator 18 is running at 32 times the synchronization pulse frequency, the outputs of decode Nand gate 92 and 94 will be at a logic 1. Similarly, if the count is higher than a predetermined number such as 34, the outputs of the two decoder gates will also be a logic 1. However, at a count between 31 and 34 the outputs of Nand gates 92 and 96 will be a logic 0. This indicates that the frequency of oscillator 18 is within a lock up range of PLL 14.

Hence, at time $T_3$, the data information appearing at the data inputs of the two inputs is transferred therethrough prior to time $t_4$ at which counter 30 is reset and the count begins for the next horizontal synchronization period. Between times $t_3$ and $t_4$, the output of Nand gate 108 is a logic 1 which permits latches 98 and 100 to control the operating states of the two controlled current sources 34 and 36 accordingly. Therefore if a logic one is transferred through latch 98 between times $t_3$ and $t_4$, which indicates oscillator 18 is either below or above the lock in frequency range of PLL 14, a logic 1 is applied to the input of Nand gate 110. However, the data transferred through latch 100 simultaneously determines the input state to Nand gate 110. If the count is to high, the Q1 output of latch 100 will also be a logic 1. This will cause the output of Nand gate 110 to go low thereby forcing the output of Nand gate 112 to a high logic state. Current source 36 will thus be turned on to sync current from node 24 to, in turn, forces the frequency of oscillator 18 to be reduced. As the Q output of latch 100 is high, its $\overline{Q}$ output will be at a logic 0 thereby forcing the output of Nand gate 116 to a zero. Current source 34 will therefore be turned off or disabled Conversely, if the count is low, the data transferred through the Q output of latch 100 will be a logic zero thereby forcing the output of Nand gate 112 to a logic zero while the output of Nand gate 116 is forced to a logic 1. Hence, current source 36 is rendered nonoperative while current source 34 is turned on to source current to terminal 24. The operating frequency of oscillator 18 will thereby be increased. Finally, if the frequency of oscillator 18 is within the lock up range of PLL 14, a logic zero will be transferred through a latch 98 between $t_3$ and $t_4$ while the output of Nand gate 86 is low thereby causing a logic zero to be transferred through latch 100. In this state, both outputs of Nand gates 112 and 116 are forced low this causes current sources 34 and 36 to be turned off or disabled.

Hence, what has been described above, is a novel frequency tracking system including a PLL in which the oscillator thereof is operated in a closed loop system in conjunction wtih a digital frequency counting system for ensuring that the frequency of the oscillator tracks the frequency of an applied synchronization pulse to the PLL, wherein the synchronization pulse frequency may vary over a predetermined range. The digital closed loop tracking or counting section counts on alternate periods of the applied synchronization pulses such that the count information obtained in response to a first one of the sync pulses is held and then transferred into a pair of latches in response to the next synchronization pulse when the count has been stopped. The count information transferred through the latches is used to determine if the count is too low, too high or within the range of the PLL and controls a pair of current sources to keep the oscillator frequency within the lock up range of the PLL.

I claim:

1. A system for tracking an applied input signal the frequency of which may vary over a predetermined range, comprising:

a phase locked loop including a phase detector having first and second inputs and an output, said first input being coupled to an input of the system to which the input signal is applied, a controlled oscillator, means for coupling said oscillator to said second input of said phase detector, and means coupled to said output of said phase detector for providing a direct current control signal to said controlled oscillator whenever the frequency of said oscillator is greater or less than the frequency of the applied input signal by a predetermined amount;

digital frequency counting means forming a closed loop with said controlled oscillator for digitally counting the frequency of said oscillator and comparing the same to the frequency of the applied input signal and for providing an error signal to said means for providing a direct current control signal whenever said oscillator frequency is outside a predetermined frequency range of the input signal frequency such that the frequency of said oscillator automatically tracks the frequency of the applied input signal.

2. The system of claim 1 wherein:

said oscillator frequency is x times greater than the applied input signal, where x is a positive integer; and said coupling means is a divide by x divider circuit.

3. The system of cliam 2 wherein said digital frequency counting means includes;

means for dividing the applied input signal frequency by two:

digital counter means having inputs coupled to the output of said oscillator and said means for dividing the applied input signal frequency for counting the frequency of the oscillator during a first period of the applied input signal;

decoder and latch means coupled to said digital counter means for receiving the count information therefrom corresponding to counting of the oscillator frequency during the next period of the applied input signal during with said counting is disabled, said decoder and latch means providing logic control output signals; and current source means responsive to said logic control output signals for providing said error signal for controlling the magnitude of said direct current control signal to said oscillator to maintain the oscillator frequency within said predetermined frequency range of the input signal frequency.

4. The system of claim 3 wherein said means for dividing the applied input signal frequency by two includes:

a flip flop having a clock input, first and second outputs, and a third output, the signal appearing at said third output being the complement of the signals appearing at said first and second outputs; and a plurality of serially coupled logic gates wherein the input of the first one of said logic gates is coupled to the input of the system to which the input signal is applied and an output of the last one of said logic gates is coupled to said clock input of said flip flop.

5. The system of claim 4 wherein said digital counter means includes:

a plurality of additional flip flops each having a clock input, first outputs at which a first logic signals are provided and a second output at which a second logic signal is provided which is the complement of said first logic signal, said clock input of each succeeding flip flop being coupled to said second output of each preceding flip flop and said clock input of the first one of said flip flops being coupled to a node; and means for coupling said node to both said input of said oscillator and said third output of said flip flop.

6. The system of claim 5 including:

said plurality of additional flip flops each having a reset input; and means for coupling said output of said last one of said plurality of logic gates and said first output of said flip flop to said reset inputs of said plurality of additional flip flops.

7. The system of claim 6 wherein said decoder and latch means includes:

a plurality of additional logic gates each having an input coupled to one of said first outputs of all but said first one and the last one of said plurality of additional flip flops respectively, and an output;

first single logic gate having an input and an output;

a second single logic gate having an input and an output;

means for coupling the outputs of said plurality of additional logic gates except for the one logic gate thereof having said input coupled to said one of said first outputs of the next to last one of said plurality of additional flip flops to said input of said first single logic gate;

means for coupling an output of said one logic gate to said input of said second single logic gate.

8. The system of claim 7 wherein said decode and latch means includes:

means for coupling one of said first outputs of said last one of said plurality of additional flip flops to said input of said first single logic gate;

means for coupling a second one of said first outputs of said last one of said plurality of additional flip flops to said input of said second single logic gate;

means for coupling a second one of said first outputs of said next to last one of said plurality of additional flip flops to said input of said first single logic gate; and means for coupling a second one of said first outputs of all of the remaining ones of said plurality of additional flip flops except for said first one thereof to said input of said second single logic gate.

9. The system of claim 8 wherein said decoder and latch means includes:

a first latch circuit having an input, a clock input and a first output, said input being coupled to said outputs of said first and second single logic gates, said clock input being coupled to a third additional output of a said last one of said serially coupled logic gates;

a second latch circuit having an input, a clock input and first and second outputs at which complementary logic signals are provided, said clock input being coupled to said third additional output of said last one of said serially coupled logic gates;

a third single logic gate having an input and an output, said input being coupled to a second output of said logic gate of said plurality of additional logic gates having said input coupled to a first output of said next to last one of said plurality of additional flip flops and said output of said third single logic gate being coupled to said input of said second latch circuit; and a fourth single logic gate having an input and output, said input being coupled to said second output of said last one of said plurality of additional flip flops and said output being coupled to said input of said second latch circuit.

10. The system of claim 9 wherein:

said current source means includes first and second serially coupled controlled current supplies for supplying said error signal wherein the interconnection therebetween is coupled to said means for providing a direct current control signal; and said decoder and latch means includes first logic circuit means having an input and an output, said output being coupled to said first controlled current supply for controlling the operation thereof; a second logic circuit means having an input and output, said output being coupled to said second controlled current supply for controlling the operation thereof; means for coupling said input of said first logic circuit means to said first outputs of said first and second latch circuits and means for coupling said input of said second logic circuit means to said second output of said second latch circuit.

* * * * *

UNITED STATES PATENT AND TRADEMARK OFFICE
CERTIFICATE OF CORRECTION

PATENT NO. : 4,876,518

DATED : October 24, 1989

INVENTOR(S) : Geoffrey W. Perkins

It is certified that error appears in the above-identified patent and that said Letters Patent is hereby corrected as shown below:

Column 1, lines 66-67, delete "a herein" and insert therefor --wherein--.

Column 4, line 26, delete "rest" and insert therefor --reset--.

Column 5, line 64, delete "sync" and insert therefor --sink--.

Signed and Sealed this

Thirtieth Day of April, 1991

Attest:

HARRY F. MANBECK, JR.

Attesting Officer

Commissioner of Patents and Trademarks